United States Patent
Kang et al.

(10) Patent No.: US 8,446,016 B2
(45) Date of Patent: May 21, 2013

(54) CHIP STACK PACKAGE

(75) Inventors: Sun-Won Kang, Seoul (KR);
Seung-Duk Baek, Hwaseong-si (KR);
Jong-Joo Lee, Suwon-si (KR)

(73) Assignee: Samsung Electronics Co., Ltd.,
Samsung-ro, Yeongtong-gu, Suwon-si,
Gyeonggi-do (KR)

( * ) Notice: Subject to any disclaimer, the term of this patent is extended or adjusted under 35 U.S.C. 154(b) by 43 days.

(21) Appl. No.: 13/224,670

(22) Filed: Sep. 2, 2011

(65) Prior Publication Data

US 2011/0316159 A1  Dec. 29, 2011

Related U.S. Application Data

(63) Continuation of application No. 12/171,035, filed on Jul. 10, 2008, now Pat. No. 8,039,928.

(30) Foreign Application Priority Data

Oct. 30, 2007 (KR) ........................ 10-2007-0109698

(51) Int. Cl.
*H01L 23/538* (2006.01)

(52) U.S. Cl.
USPC ........... 257/777; 257/621; 257/686; 257/774; 257/E23.169; 257/E25.006; 257/E25.013; 257/E25.021; 438/667; 438/672; 438/675

(58) Field of Classification Search
USPC .................... 257/621, 686, 774, 77, E23.169, 257/E25.006, E25.013, E25.021; 438/667, 438/672, 675
See application file for complete search history.

(56) References Cited

U.S. PATENT DOCUMENTS

| | | | |
|---|---|---|---|
| 5,481,133 A | 1/1996 | Hsu | |
| 5,682,062 A | 10/1997 | Gaul | |
| 6,114,768 A | 9/2000 | Gaul et al. | |
| 6,727,116 B2 | 4/2004 | Poo et al. | |
| 2004/0080040 A1 | 4/2004 | Dotta et al. | |
| 2004/0251529 A1 | 12/2004 | Lee et al. | |
| 2005/0017338 A1 | 1/2005 | Fukazawa | |
| 2005/0051883 A1* | 3/2005 | Fukazawa | ...... 257/686 |
| 2006/0231928 A1 | 10/2006 | Dotta et al. | |
| 2007/0126121 A1 | 6/2007 | Shue et al. | |
| 2008/0136023 A1 | 6/2008 | Komai et al. | |

FOREIGN PATENT DOCUMENTS

| | | |
|---|---|---|
| JP | 2004-134679 | 4/2004 |
| JP | 2004-152810 | 5/2004 |
| JP | 2006-173378 | 6/2006 |

* cited by examiner

*Primary Examiner* — Peniel M Gumedzoe
(74) *Attorney, Agent, or Firm* — Muir Patent Consulting, PLLC (57) ABSTRACT

A chip stack package includes a plurality of chips that are stacked by using adhesive layers as intermediary media, and a through via electrode formed through the chips to electrically couple the chips. The through via electrode is classified as a power supply through via electrode, a ground through via electrode, or a signal transfer through via electrode. The power supply through via electrode and the ground through via electrode are formed of a first material such as copper, and the signal transfer through via electrode is formed of second material such as polycrystalline silicon doped with impurities. The signal transfer through via electrode may have a diametrically smaller cross section than that of each of the power supply through via electrode and the ground through via electrode regardless of their resistivities.

39 Claims, 9 Drawing Sheets

CHIP STACK PACKAGE

CROSS-REFERENCE TO RELATED PATENT APPLICATION

This application claims the benefit of priority to U.S. patent application Ser. No. 12/171,035, filed on Jul. 10, 2008, which claims the benefit of priority to Korean Patent Application No. 10-2007-0109698, filed on Oct. 30, 2007, in the Korean Intellectual Property Office, the disclosure of which are incorporated herein in their entirety by reference.

BACKGROUND

1. Field of the Invention

The present invention relates to a chip stack package, and more particularly, to a chip stack package including chips that are stacked at a wafer level or a chip level.

2. Description of the Related Art

A recent trend of the semiconductor industry is to make inexpensive semiconductor products compact, thin, light, fast, multifunctional and highly-efficient, so as to have high reliability. To achieve this, a package technology has been used as one of the important technologies for designing such semiconductor products.

For example, a chip stack package is a chip-sized package, and is configured by stacking chips at a wafer level or a chip level if necessary. Since chips are stacked on a wiring substrate, a chip stack package can have a high stack density of chips. In addition, since different kinds of chips (e.g., a memory chip and a control chip) can be stacked, the chip stack package is used as a system-in-package (SiP).

In a chip stack package, a plurality of chips needs to be electrically connected to one another, wherein the chips are disposed on upper and lower portions of the chip stack package. Accordingly, the chip stack package includes a through via electrode formed through the chips so that the chips can be electrically connected to each other via the through via electrode. However, since the chips are connected to each other using the through via electrode in the chip stack package, the electrical characteristics of the chip stack package can deteriorate.

SUMMARY

The present invention provides a chip stack package having improved electrical characteristics.

According to an aspect of the present invention, there is provided a chip stack package comprising a plurality of chips that are stacked using adhesive layers as intermediary media; and further comprising a through via electrode formed through the chips to electrically couple the chips, wherein the through via electrode comprises one of a power supply through via electrode, a ground through via electrode, and a signal transfer through via electrode, wherein the power supply through via electrode and the ground through via electrode are formed of a first material, and wherein the signal transfer through via electrode is formed of a second material different from the first material.

The resistivity of the first material may be smaller than the resistivity of the second material.

The power supply through via electrode and the ground through via electrode may be each formed of copper, and the signal transfer through via electrode may be formed of polycrystalline silicon doped with impurities. The chips may be formed on a wafer and the chips are stacked at a wafer level, thereby comprising a wafer stack package. The chips may be formed on a wiring substrate, and external input/output (I/O) terminals may be formed on a bottom surface of the wiring substrate.

According to another aspect of the present invention, there is provided a chip stack package comprising a plurality of chips that are stacked using adhesive layers as intermediary media; and a through via electrode formed through the chips in order to electrically connect the chips with each other. The through via electrode may be classified as a power supply through via electrode, a ground through via electrode, and a signal transfer through via electrode. The size of a cross section of each of the power supply through via electrode and the ground through via electrode is different from the size of a cross section of the signal transfer through via electrode.

A diameter of each of the power supply through via electrode and the ground through via electrode may be greater than a diameter of the signal transfer through via electrode. The power supply through via electrode and the ground through via electrode may be each formed of copper, and the signal transfer through via electrode may be formed of polycrystalline silicon doped with impurities.

According to another aspect of the present invention, the chip stack package may comprise at least two power supply through via electrodes formed in a central part or at both edges of the chip stack package and disposed adjacent to each other, the at least two power supply through via electrodes being configured to supply power to the chip stack package; at least two ground through via electrodes formed in the central part or at both edges of the chip stack package and disposed adjacent to each other and to the at least two power supply through via electrodes, the at least two ground through via electrodes being configured to ground the chip stack package; and at least two signal transfer through via electrodes formed in the central part or at both edges of the chip stack package and disposed adjacent to each other and to the at least two ground through via electrodes, the at least two signal transfer through via electrodes being configured to transfer an electrical signal to the chip stack package.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention can be applied to a chip stack package including chips stacked at a wafer level or a chip level. In particular, the present invention can be applied to a chip stack package including chips stacked at a wafer level, i.e., a wafer stack package. In the wafer stack package, the thickness of each of the stacked chips can be reduced, thereby reducing the thickness of the wafer stack package.

In the chip stack package including the chips stacked at a wafer level and a chip level, a through via electrode may have three classifications: a power supply through via electrode, a ground through via electrode, and a signal transfer through via electrode. In addition, the chip stack package may be configured so that the power supply through via electrode, the ground through via electrode, and the signal transfer through via electrode have relatively different diameters, and may be formed of relatively different materials according to their electrical characteristics, thereby improving the electrical characteristics of the chip stack package.

For example, by increasing the cross sections of the power supply through via electrode and the ground through via electrode, the inductance and resistance of each of the power supply through via electrode and the ground through via electrode can be reduced. In addition, an entire current can smoothly flow through the power supply through via electrode and the ground through via electrode, thereby improving the noise characteristics of the chip stack package. By reducing the cross section of the signal transfer through via electrode as compared with that of each of the power supply through via electrode and the ground through via electrode, the capacitance of the signal transfer through via electrode can be reduced, thereby improving the signal transfer characteristics of the chip stack package.

As another example, the power supply through via electrode and the ground through via electrode are each formed of a material having a low resistivity, such as copper, and thus an entire current can smoothly flow through the chip stack package, thereby improving the noise characteristics of the chip stack package. In addition, the signal transfer through via electrode is formed of polycrystalline silicon doped with impurities and thus has a greater resistivity than that of copper. For example, the impurities may be boron, arsenic and phosphorus. By reducing the size of the signal transfer through via electrode by using polycrystalline silicon for forming the signal transfer through via electrode, the manufacturing costs of the chip stack package can be reduced.

In the chip stack package, the power supply through via electrode, the ground through via electrode, and the signal transfer through via electrode can be separately formed or combined if necessary, as described above.

The present invention will now be described more fully with reference to the accompanying drawings, in which exemplary embodiments of the invention are shown. The present invention may, however, be embodied in many different forms and should not be construed as being limited to the embodiments set forth herein; rather, these embodiments are provided so that this disclosure will be thorough and complete, and will fully convey the concept of the invention to one skilled in the art. The same reference numerals in the drawings denote the same element.

Figure 1:
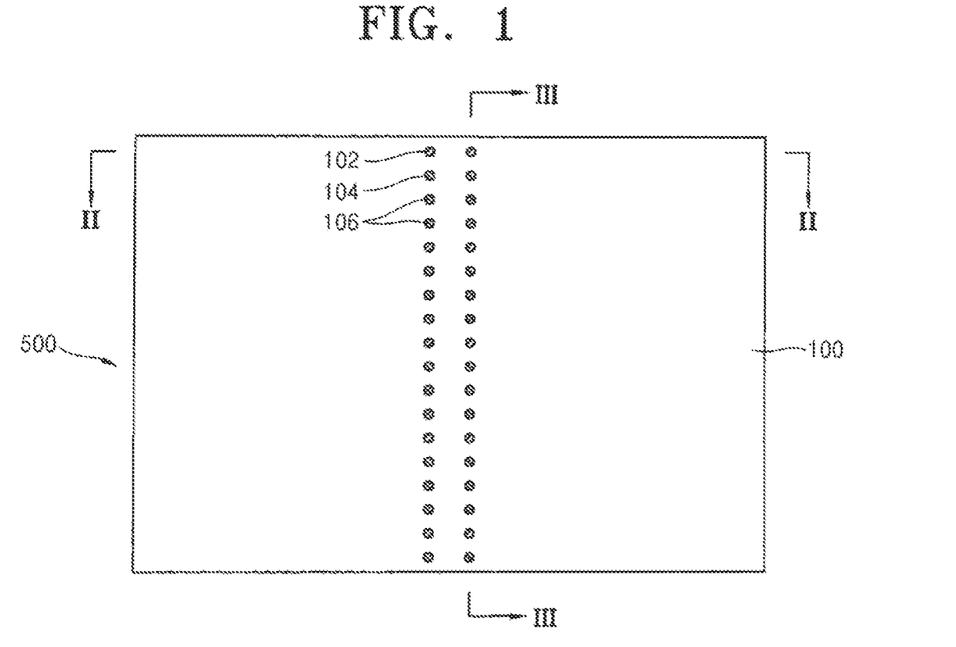
FIG. 1 is a plan view of a chip stack package according to an embodiment of the present invention.
Figure 2:
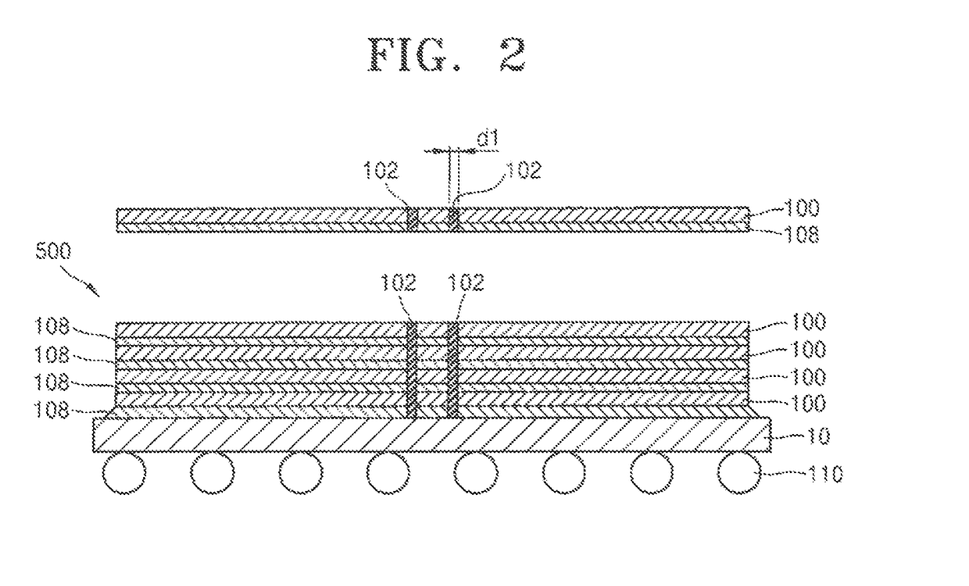
FIGS. 2 and 3 are cross-sectional views of the chip stack package taken along lines II-II and III-III of FIG. 1, respectively.
Figure 3:
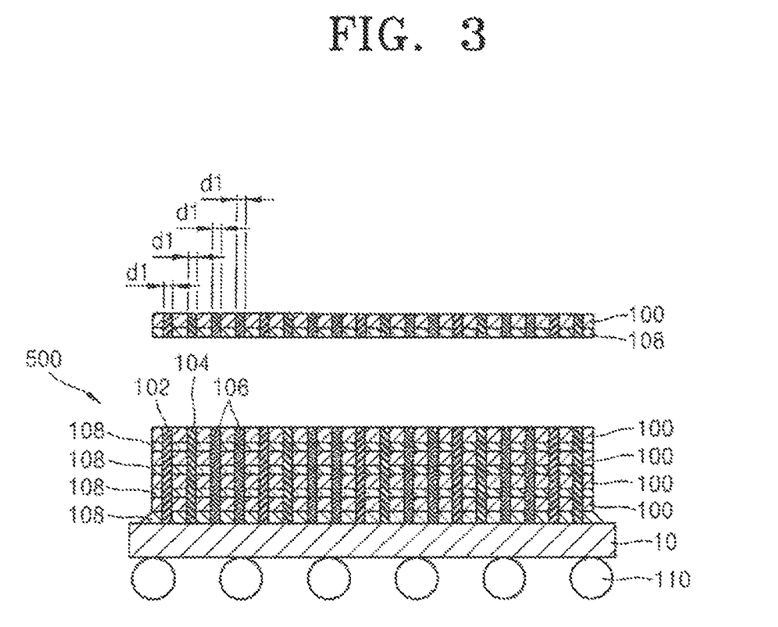

FIG. 1 is a plan view of a chip stack package 500 according to an embodiment of the present invention. FIGS. 2 and 3 are cross-sectional views of the chip stack package 500 taken along lines II-II and III-III of FIG. 1, respectively.

Referring to FIGS. 1 through 3, the chip stack package 500 includes a wiring substrate 10, a plurality of chips 100, and a plurality of adhesive layers 108, wherein the chips 100 are stacked and adhered to each other by the adhesive layers 108 as intermediary media on the wiring substrate 10 by using a wafer level or chip level. The chips 100 are electrically coupled to each other using through via electrodes 102, 104, and 106 that are formed through the chips 100 and electrically coupled to the wiring substrate 10.

The chip 100 is formed on a silicon wafer, and the through via electrodes 102, 104, and 106 are formed through the silicon wafer. External input/output (I/O) terminals 110, each of which may be shaped like a solder ball, are formed on a bottom surface of the wiring substrate 10. The adhesive layers 108 may each be an adhesive tape. The wiring substrate 10 is optional and may or may not be included or used.

In FIGS. 1 through 3, the number of the chips 100 is illustrated to be four, but more or less than four may be used if necessary. In FIGS. 1 through 3, the sizes of the chips 100 are illustrated to be the same, but the sizes may be different if necessary. In addition, the chips 100 may each be a memory chip or a control chip. In FIG. 2, an upper part of the diagram illustrates one of the chips 100.

When the chips 100 are stacked at the wafer level, the chip 100 may be one of the plurality of chips 100, each formed on the silicon wafer. In this case, the chip stack package 500 may be a wafer stack package. When the chip stack package 500 is the wafer stack package, wafers including the chips 100 may be stacked on the wiring substrate 10, and then the through via electrodes 102, 104, and 106 may be simultaneously formed. In the wafer stack package stacked at the wafer level, the thickness of the chip 100 can be remarkably reduced, and thus the entire thickness of the chip stack package 500 can be reduced. In FIGS. 1 through 3, when the chips 100 are stacked at the chip level, the through via electrodes 102, 104, and 106 may be formed in each of the chips 100, and then the chips 100 can be stacked.

As described above, the chip stack package 500 includes the through via electrodes 102, 104, and 106 formed in a central part of the chip stack package 500 in order to electrically couple the chips 100 with each other. The through via electrodes 102, 104, and 106 are each configured to have a diameter d1 in the range of about several hundreds of nm to several tens of µm. The through via electrodes 102, 104, and 106 may each be formed as follows: the silicon wafer including each of the chips 100 is perforated by a laser or using photolithography to form a via hole, and the via hole is completely or partially filled with polycrystalline silicon doped with a conductive material such as copper or impurities (e.g., boron, arsenic, or phosphorus), which may be formed using plating or chemical vapor deposition (CVD). When the via hole is formed using photolithography, reactive ion etching (RIE) is used. As a result, the through via electrodes 102, 104, and 106 are used for electrically coupling the chips 100 disposed on upper and lower portions of the chip stack package 500.

The through via electrodes 102, 104, and 106 may be formed in the central part of the chip stack package 500. In this regard, the through via electrodes 102, 104, and 106 may be formed directly in a chip pad (not shown) formed on the chip 100, or alternatively, the chip pad may be formed around the through via electrodes 102, 104, and 106. In addition, the through via electrodes 102, 104, and 106 may be formed in a redistribution chip pad in which the chip pad is redistributed. In FIGS. 1 through 3, the chip stack package 500 has a center pad structure having the chip pad formed in the center part of the chip stack package 500. Thus, when the chip pad and the wiring substrate 10 are coupled using bonding wires (where necessary), it is easy to perform a wire bonding process. In addition, the redistribution of the chip pad is not required, and thus the chip stack package 500 can be more freely designed.

The through via electrodes 102, 104, and 106 of the chip stack package 500 may be respectively classified as follows: the power supply through via electrode 102 for supplying power to the chip stack package 500, the ground through via electrode 104 for grounding the chip stack package 500, and the signal transfer through via electrode 106 for transferring an electrical signal to the chip stack package 500.

In FIGS. 1 through 3, the power supply through via electrode 102, the ground through via electrode 104, and the signal transfer through via electrode 106 may be formed of relatively different materials according to their functions. That is, the power supply through via electrode 102 and the ground through via electrode 104 are each formed of a material having a low resistivity, such as copper. When the power supply through via electrode 102 and the ground through via electrode 104 are each formed of copper, the resistances of the power supply through via electrode 102 and the ground through via electrode 104 are reduced. In addition, an entire current can smoothly flow through the chip stack package 500, thereby improving the noise characteristics of the chip stack package 500.

The signal transfer through via electrode 106 may be formed of polycrystalline silicon doped with impurities, of which the resistivity is greater than copper. When the signal transfer through via electrode 106 is formed of polycrystalline silicon doped with impurities, since polycrystalline silicon is inexpensive, the manufacturing costs of the chip stack package 500 can be reduced compared with the case of copper. In addition, when the signal transfer through via electrode 106 is formed of polycrystalline silicon, the signal transfer through via electrode 106 can previously be formed in the silicon wafer such as during the manufacturing of the chips 100.

Figure 4:
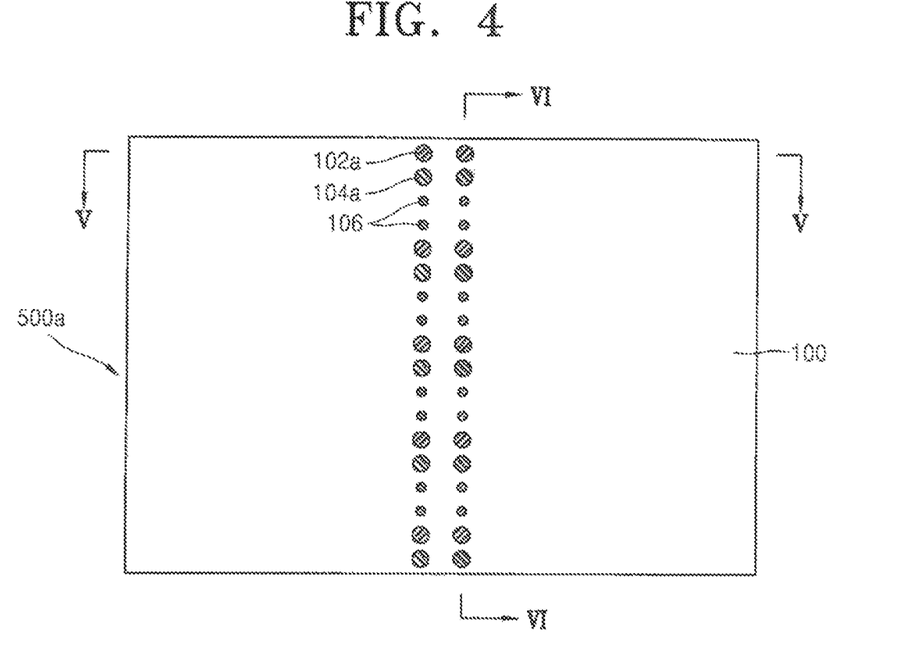
FIG. 4 is plan view of a chip stack package according to another embodiment of the present invention.
Figure 5:
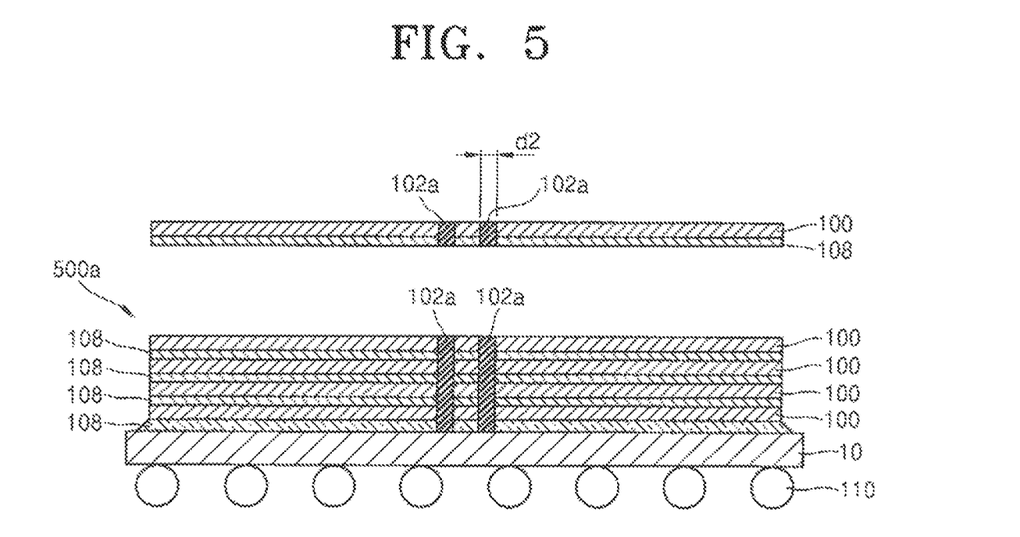
FIGS. 5 and 6 are cross-sectional views of the chip stack package taken along lines V-V and VI-VI of FIG. 4, respectively.
Figure 6:
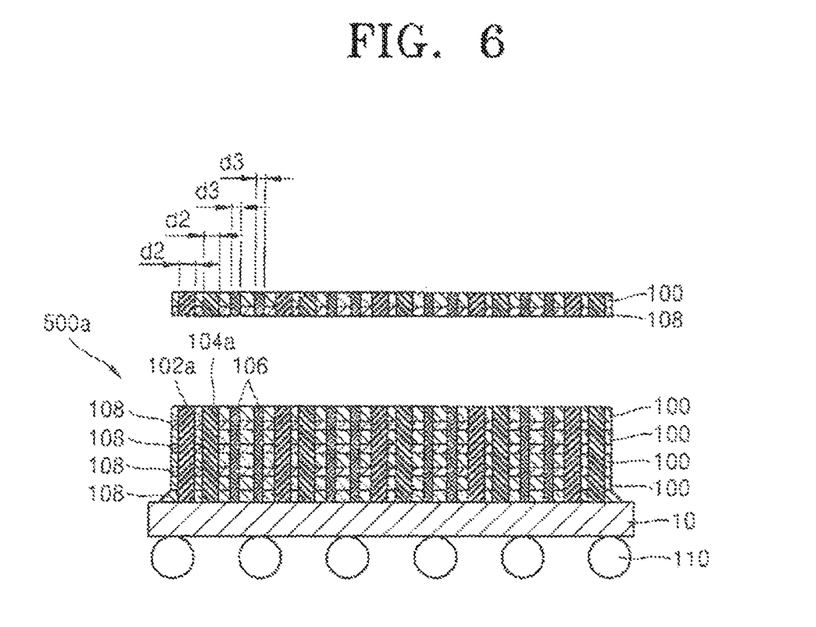

FIG. 4 is plan view of a chip stack package 500a according to another embodiment of the present invention. FIGS. 5 and 6 are cross-sectional views of the chip stack package 500a taken along lines V-V and VI-VI of FIG. 4, respectively.

The chip stack package 500a is substantially the same as the chip stack package 500 except that the diameter d2 of each of a power supply through via electrode 102a and a ground through via electrode 104a is greater than the diameter d3 of the signal transfer through via electrode 106. Thus, the descriptions of FIGS. 1 through 3 substantially apply to the current embodiment.

The chip stack package 500a may be configured so that the size of each of the cross sections of the power supply through via electrode 102a and the ground through via electrode 104a may be different from the size of the cross section of the signal transfer through via electrode 106 according to their functions.

Specifically, the power supply through via electrode 102a and the ground through via electrode 104a of the chip stack package 500a are each configured to have a cross section of which the diameter d2 is several tens of μm and thus greater than that of the signal transfer through via electrode 106. The signal transfer through via electrode 106 is configured to have a cross section having the diameter d3 in the range of about several hundreds of nm to several μm and thus smaller than that of each of the power supply through via electrodes 102a and the ground through via electrodes 104a.

By increasing the cross section of each of the power supply through via electrodes 102a and the ground through via electrodes 104a, the inductance and resistance of each of the power supply through via electrodes 102a and the ground through via electrodes 104a can be reduced. Thus, current can smoothly flow through the chip stack package 500a, thereby improving the noise characteristics of the chip stack package 500a. In addition, by reducing the cross section of the signal transfer through via electrodes 106, the capacitance of the signal transfer through via electrodes 106 can be reduced, thereby improving the signal characteristics of the chip stack package 500a.

In addition, the chip stack package 500a is configured so that the power supply through via electrode 102a and the ground through via electrode 104a are formed of copper and the signal transfer through via electrode 106 is formed of polycrystalline silicon doped with impurities. The power supply through via electrode 102a and the ground through via electrode 104a can easily be formed with each having a bigger cross section than that of the signal transfer through via electrode 106 by using copper to form the power supply through via electrode 102a and the ground through via electrode 104a. The signal transfer through via electrode 106 can easily be formed with a smaller cross section than those of the power supply through via electrode 102a and the ground through via electrode 104a by using polycrystalline silicon doped with impurities to form the signal transfer through via electrode 106.

When the signal transfer through via electrode 106 is formed of polycrystalline silicon doped with impurities, a higher number of signal transfer through via electrodes can be formed in a given area by reducing their diameter. The capacitance of the signal transfer through via electrode 106 (having a relatively small diameter) is reduced, thereby improving the signal characteristics of the chip stack package 500a.

Figure 7:
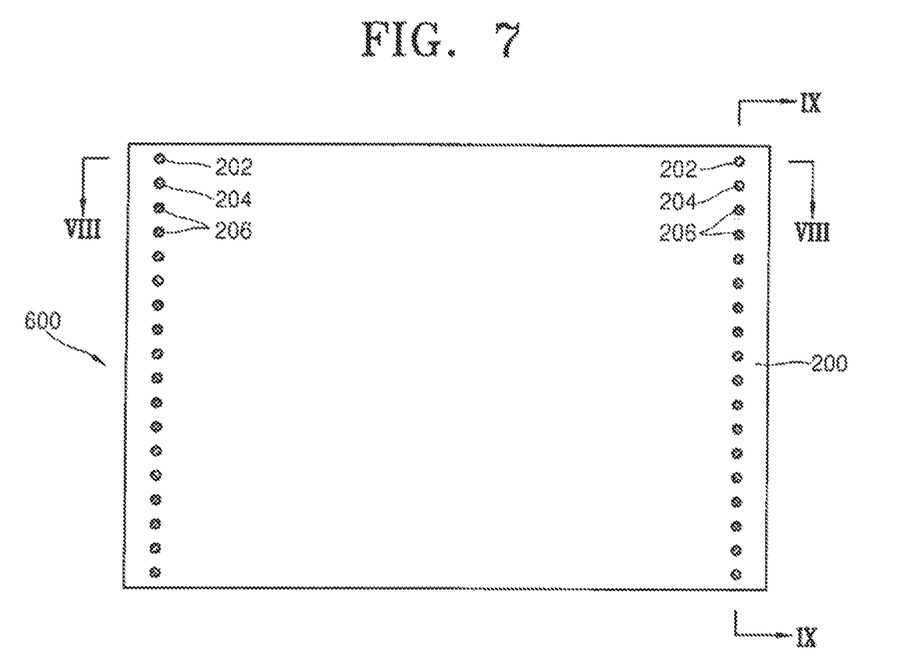
FIG. 7 is a plan view of a chip stack package according to another embodiment of the present invention.
Figure 8:
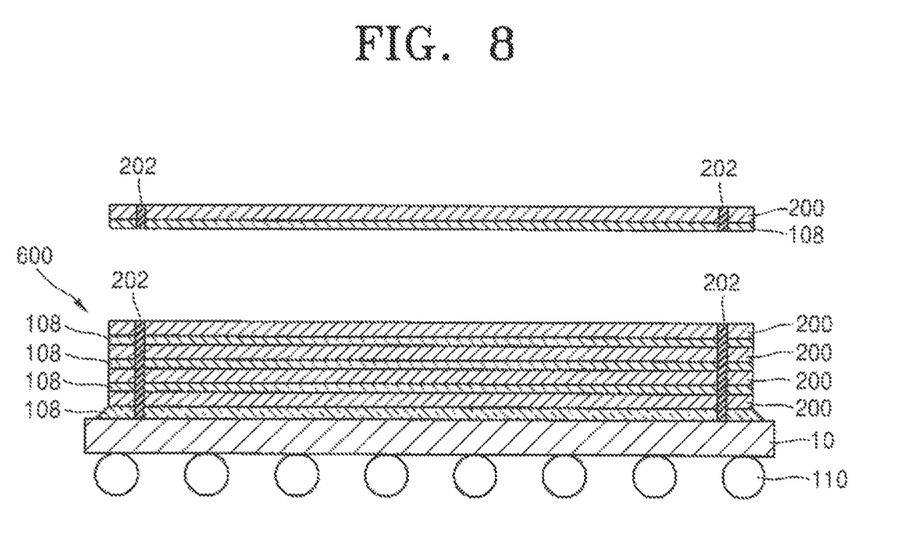
FIGS. 8 and 9 are cross-sectional views of the chip stack package taken along lines VIII-VIII and IX-IX of FIG. 7, respectively.
Figure 9:
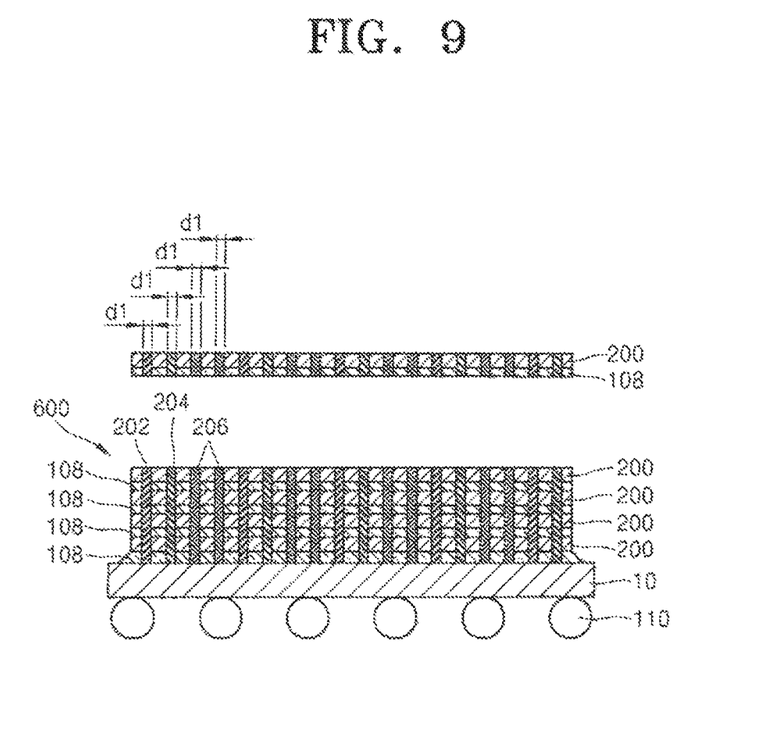

FIG. 7 is a plan view of a chip stack package 600 according to another embodiment of the present invention. FIGS. 8 and 9 are cross-sectional views of the chip stack package 600 taken along lines VIII-VIII and IX-IX of FIG. 7, respectively.

In particular, the chip stack package 600 is substantially the same as the chip stack package 500 except that through via electrodes 202, 204, and 206 are formed in the vicinity of both edges of a plurality of chips 200. Thus, the descriptions of FIGS. 1 through 3 can be substantially applied to the current embodiment. More particularly, the chip stack package 600 includes a wiring substrate 10, the chips 200, and a plurality of adhesive layers 108, wherein the chips 200 are stacked and adhered to each other by the adhesive layers 108 as intermediary media. The chips 200 are electrically coupled to each other by the through via electrodes 102, 104, and 106 that are formed through the chips 200 and electrically coupled to the wiring substrate 10.

The chip 200 is formed on a silicon wafer, and the through via electrodes 202, 204, and 206 are formed through the silicon wafer. External I/O terminals 110, each shaped like a solder ball, are formed on a bottom surface of the wiring substrate 10. The adhesive layers 108 may each be an adhesive tape. The wiring substrate 10 is optional and may or may not be included or used.

In FIGS. 7 through 9, the number of the chips 100 is illustrated to be four, but persons having skill in the art will recognize that more than one may be used if necessary. In FIGS. 7 through 9, the sizes of the chips 200 are illustrated to be the same, but the sizes may be different if necessary. In addition, the chips 200 may each be a memory chip or a control chip. In FIG. 8, an upper part of the diagram illustrates one of the chips 200.

In FIGS. 7 through 9, when the chips 200 are stacked at a wafer level, the chip 200 may be one of the plurality of chips 200 formed on the silicon wafer. In this case, the chip stack package 600 may be a wafer stack package. When the chip stack package 600 is a wafer stack package, wafers including the chips 200 may be stacked on the wiring substrate 10, and then power supply, ground, and signal transfer through via electrodes 202, 204, and 206 may be simultaneously formed. In the wafer stack package stacked at the wafer level, the thickness of the chip 200 is reduced, and thus the entire thickness of the chip stack package 600 can be reduced. In FIGS. 7 through 9, when the chips 200 are stacked at a chip level, the power supply, ground, and signal transfer through via electrodes 202, 204, and 206 may be formed in the chip 200, and then the chips 200 can be stacked.

The chip stack package 600 includes the power supply, ground, and signal transfer through via electrodes 202, 204, and 206 formed in the vicinity of both edges of the chips 200. In this regard, the power supply, ground, and signal transfer through via electrodes 202, 204, and 206 may be formed directly in a chip pad (not shown) formed on the chip 200, or alternatively, the chip pad may be formed around the power supply, ground, and signal transfer through via electrodes 202, 204, and 206. In addition, the power supply, ground, and signal transfer through via electrodes 202, 204, and 206 may be formed in a redistribution chip pad in which the chip pad is redistributed. In FIGS. 7 through 9, the chip stack package 600 has an edge pad structure having the chip pad formed in the vicinity of the edges of the chip stack package 600.

In FIGS. 7 through 9, the power supply through via electrode 202, the ground through via electrode 204, and the signal transfer through via electrode 206 are formed of relatively different materials according to their functions, like in the case of the embodiment of FIGS. 1 though 3.

Specifically, the power supply through via electrode 202 and the ground through via electrode 204 are each formed of a material having a low resistivity, such as copper. When the power supply through via electrode 202 and the ground through via electrode 204 are formed of copper, the resistances of the power supply through via electrode 202 and the ground through via electrode 204 are reduced. In addition, current can smoothly flow through the chip stack package 600, thereby improving the noise characteristics of the chip stack package 600.

The signal transfer through via electrode 206 is formed of polycrystalline silicon doped with impurities and of which the resistivity is greater than copper. When the signal transfer through via electrode 206 is formed of polycrystalline silicon doped with impurities, since polycrystalline silicon is inexpensive, the manufacturing costs of the chip stack package 600 can be reduced compared with the case of copper. In addition, when the signal transfer through via electrode 206 is formed of polycrystalline silicon, the signal transfer through via electrode 206 can previously be formed in the silicon wafer such as during the manufacturing the chips 200.

Figure 10:
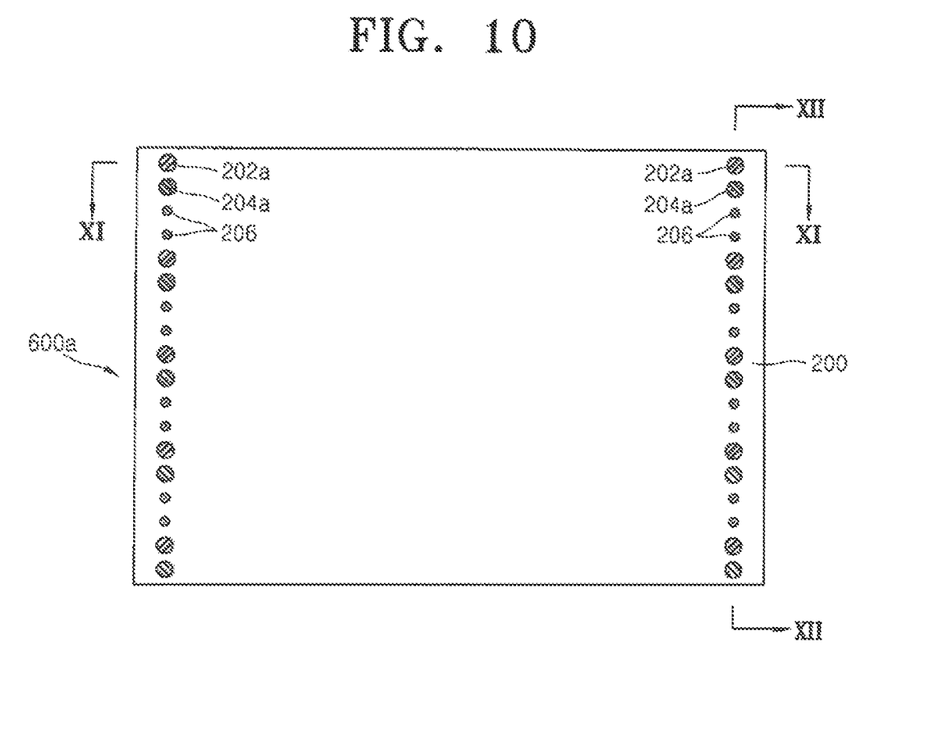
FIG. 10 is a plan view of a chip stack package according to another embodiment of the present invention.
Figure 11:
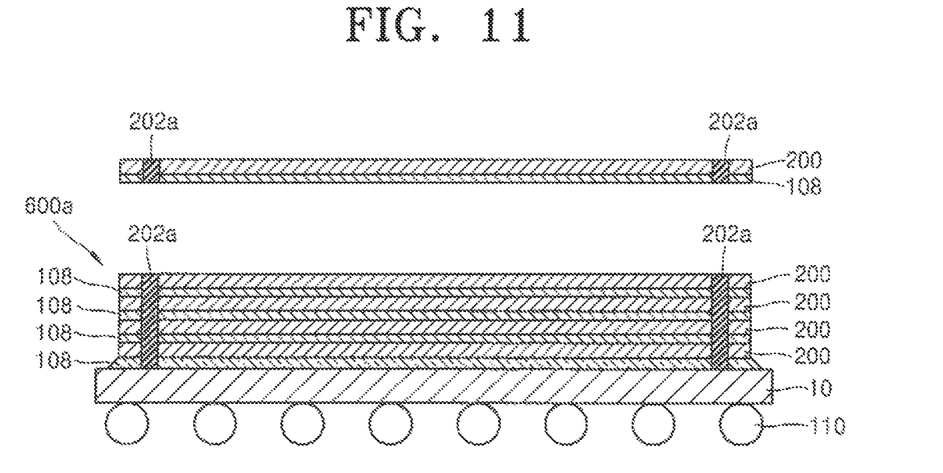
FIGS. 11 and 12 are cross-sectional views of the chip stack package taken along lines XI-XI and XII-XII of FIG. 10, respectively.
Figure 12:
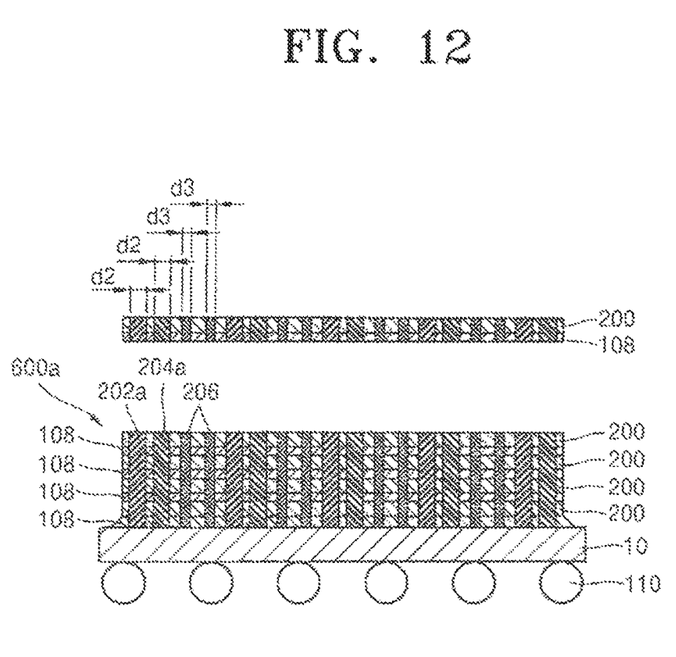

FIG. 10 is a plan view of a chip stack package 600a according to another embodiment of the present invention. FIGS. 11 and 12 are cross-sectional views of the chip stack package 600a taken along lines XI-XI and XII-XII of FIG. 10, respectively.

In particular, the chip stack package 600a is substantially the same as the chip stack package 600 except that a diameter d2 of each of a power supply through via electrode 202a and a ground through via electrode 204a is greater than a diameter d3 of a signal transfer through via electrode 206. Thus, the descriptions of FIGS. 7 through 9 can be substantially applied to the current embodiment.

The chip stack package 600a is configured so that the size of each of the cross sections of the power supply through via electrode 202a and the ground through via electrode 204a may be different from the size of a cross section of the signal transfer through via electrode 206.

Specifically, the power supply through via electrode 202a and the ground through via electrode 204a of the chip stack package 600a are each configured to have a cross section having the diameter d2 in the range of about several μm to several tens of μm and thus greater than that of the signal transfer through via electrode 206. The signal transfer through via electrode 206 is configured to have a cross section having the diameter d1 in the range of about several hundreds of nm to several μm and thus smaller than that of each of the power supply through via electrodes 202a and the ground through via electrodes 204a.

Likewise, by increasing the cross section of each of the power supply through via electrodes 202a and the ground through via electrodes 204a, the inductance and resistance of each of the power supply through via electrodes 202a and the ground through via electrodes 204a can be reduced. Thus, an entire current can smoothly flow through the chip stack package 600a, thereby improving the noise characteristics of the chip stack package 600a. In addition, by reducing the cross section of the signal transfer through via electrodes 206, the capacitance of the signal transfer through via electrodes 206 can be reduced, thereby improving the signal transfer characteristics of the chip stack package 600a.

In addition, the chip stack package 600a is configured so that the power supply through via electrode 202a and the ground through via electrode 204a are formed of copper and the signal transfer through via electrode 206 is formed of polycrystalline silicon doped with impurities. The power supply through via electrode 202a and the ground through via electrode 204a can be easily formed with a bigger diametrical cross section by using copper to form the power supply through via electrode 202a and the ground through via electrode 204a. The signal transfer through via electrode 206 can be easily formed so as to have a small cross section by using polycrystalline silicon doped with impurities to form the signal transfer through via electrode 206.

In particular, when the signal transfer through via electrode 206 is formed of polycrystalline silicon doped with impurities, a higher number of signal transfer through via electrodes can be formed in a given area by reducing their diameters as compared to that of the signal transfer through via electrode 206. The capacitance of the signal transfer through via electrode 206 having a relatively small diameter is reduced, thereby improving the signal characteristics of the chip stack package 600a.

Figure 13:
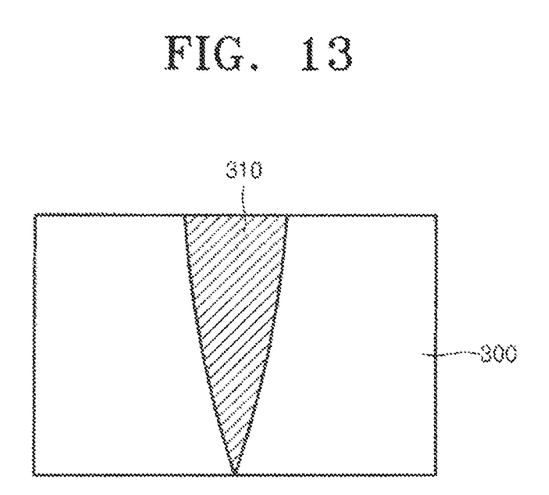
FIGS. 13 and 14 are cross-sectional views of through via electrodes that may be used in chip stack packages, according to embodiments of the present invention, respectively.
Figure 14:
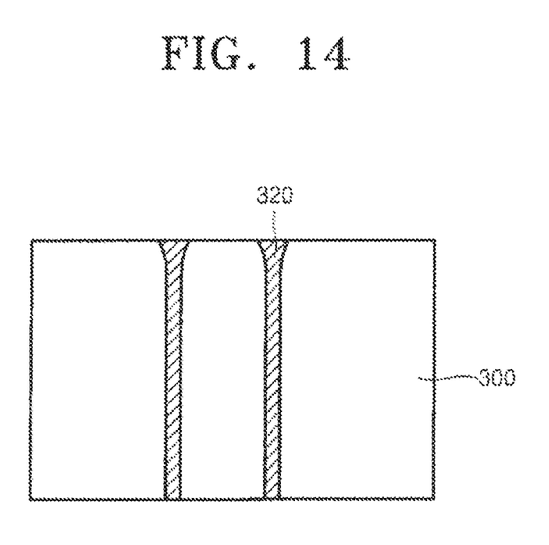

FIGS. 13 and 14 are cross-sectional views of through via electrodes 310 and 320, respectively, that may be used in chip stack packages, according to embodiments of the present invention.

In particular, the through via electrode 310 illustrated in FIG. 13 is formed by filling a via hole through a silicon wafer 300 with copper. The through via electrode 320 illustrated in FIG. 14 is formed, by filling a via hole through the silicon wafer 300 with polycrystalline silicon doped with impurities. As illustrated in FIG. 13, the through via electrode 310, formed of copper, has a small aspect ratio and a greater diameter, in the range of about several μm to several tens of μm, and thus it can be seen that the cross section of the through via electrode 310 is greater. Since the through via electrode 310, formed of copper, has a greater diameter, the through via electrode 310 may be formed directly in a pad when a chip is actually manufactured. Alternatively, the through via electrode 310 may be formed in a scribe region. Thus, the through via electrode 310, formed of copper, is advantageous for a power supply through via electrode and a ground through via electrode, as described above.

In addition, as illustrated in FIG. 14, since the through via electrode 320 formed of polycrystalline silicon doped with impurities has a greater aspect ratio and a smaller diameter in the range of about several hundreds of nm to several μm, it can be seen that the cross section of the through via electrode 320 is smaller. Since the through via electrode 320 formed of polycrystalline silicon doped with impurities has a small diameter, the through via electrode 320 may be formed in the vicinity of a circuit unit when a chip is actually manufactured. Thus, the through via electrode 320, formed of polycrystalline silicon doped with impurities, is advantageous for a signal transfer through via hole, as described above. According to the above description, if the through via electrode 310 that is formed of copper and the through via electrode 320 that is formed of polycrystalline silicon doped with impurities are appropriately used according to design, the electrical characteristics of a chip stack package can be improved.

According to the above embodiments of the present invention, in a chip stack package including chips that are stacked at a wafer level or a chip level, a through via electrode may be classified as a power supply via electrode, a ground through via electrode, or a signal transfer through via electrode. In addition, the chip stack package is configured so that the power supply through via electrode, the ground through via electrode, and the signal transfer through via electrode may have relatively different diameters and may be formed of relatively different materials according to their electrical characteristics, thereby improving the electrical characteristics of the chip stack package.

Moreover, the power supply through via electrode and the ground through via electrode are formed of copper having a low resistivity and have big cross sections. Thus, the inductances and resistances of the power supply through via electrode and the ground through via electrode are reduced. In addition, all of the current can smoothly flow through the chip stack package, thereby improving the noise characteristics of the chip stack package. The signal transfer through via electrode is formed of polycrystalline silicon and has a diametrically smaller cross section than that of each of the power supply through via electrode and the ground through via electrode regardless of their resistivities. Thus, the capacitance of the signal transfer through via electrode is reduced, thereby improving the signal transfer characteristics of the chip stack package.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A chip stack package comprising a plurality of chips that are stacked, and further comprising:
a first chip of the plurality of chips, the first chip having an upper surface and a lower surface;
a first through via electrode formed through at least a first portion of the first chip, at least a portion of the first through via electrode being exposed to the outside of the first chip at at least one surface of the first chip; and
a second through via electrode formed through at least the first portion of the first chip, at least a portion of the second through via electrode being exposed to the outside of the first chip at at least one surface of the first chip,
wherein at the first portion of the first chip, the first through via electrode is formed of a first material and the second through via electrode is formed of a second material different from the first material and does not include the first material.

2. The chip stack package of claim 1, wherein a resistivity of the first material is smaller than a resistivity of the second material.

3. The chip stack package of claim 2, wherein the first through via electrode is formed of copper, and the second through via electrode is formed of polycrystalline silicon doped with impurities.

4. The chip stack package of claim 1, wherein the chips include a wafer and the chips are stacked at a wafer level, thereby comprising a wafer stack package.

5. The chip stack package of claim 1, wherein the chips are formed on a wiring substrate, and external input/output (I/O) terminals are formed on a bottom surface of the wiring substrate.

6. The chip stack package of claim 1, wherein a diameter of the first through via electrode is greater than a diameter of the second through via electrode.

7. The chip stack package of claim 6, wherein a diameter of the first through via electrode is in the range of about several μm to several tens of μm, and wherein a diameter of the second through via electrode is in the range of about several hundreds of nm to several μm.

8. The chip stack package of claim 1, wherein:
the first material is continuously formed along the length of the first through via electrode at least through two of the plurality of chips, and
the second material is continuously formed along the length of the second through via electrode at least through two of the plurality of chips.

9. The chip stack package of claim 1, wherein the first through via electrode comprises a power supply through via electrode, and further comprising:
a third through via electrode formed through at least the first portion of the first chip, the third through via electrode comprising a ground through via electrode,
wherein at the first portion of the first chip, the third through via electrode is formed of the second material, and the third through via electrode has substantially the same cross section size as the first through via electrode.

10. A chip stack package comprising a plurality of chips that are stacked, and further comprising:
a first chip of the plurality of chips, the first chip having an upper surface and a lower surface;
a first through via electrode formed through at least a first portion of the first chip such that the first through via electrode includes a material that fills a first hole in the first portion of first chip, at least a portion of the first through via electrode being exposed to the outside of the first chip at at least one surface of the first chip; and
a second through via electrode formed through at least the first portion of the first chip such that the second through via electrode includes a material that fills a second hole in the first portion of first chip, at least a portion of the second through via electrode being exposed to the outside of the first chip at at least one surface of the first chip;
wherein the material that fills the first hole to form the first through via electrode is different from the material that fills the second hole to form the second through via electrode, and the material that fills the first hole to form the first through via electrode is not included in the second though via electrode.

11. The chip stack package of claim 10, wherein:
the material that fills the hole to form the first through via electrode includes a metal; and
the material that fills the second hole to form the second through via electrode includes polycrystalline silicon doped with impurities.

12. The chip stack package of claim 11, wherein:
the first through via electrode completely fills in the first hole; and
the second through via electrode completely fills in the second hole.

13. The chip stack package of claim 10, wherein the first through via electrode has a greater diameter than a diameter of the second through via electrode.

14. The chip stack package of claim 10, wherein the first and second through via electrodes are formed entirely through the first chip.

15. The package of claim 10, wherein a resistivity of the material that fills the first hole is smaller than a resistivity of the material that fills the second hole.

16. A chip stack package comprising a plurality of chips that are stacked, and further comprising:
a first chip of the plurality of chips, the first chip including a silicon wafer portion;
a first through via electrode formed through the silicon wafer portion, at least a portion of the first through via electrode being exposed to the outside of the first chip on at least one surface of the first chip; and
a second through via electrode formed through the silicon wafer portion, at least a portion of the second through via electrode being exposed on at least one surface of the first chip,
wherein the first through via electrode includes a first material, and the second through via electrode includes a second material different from the first material, wherein the first through via electrode does not include the second material.

17. The chip stack package of claim 16, wherein a resistivity of the first material is smaller than a resistivity of the second material.

18. The chip stack package of claim 17, wherein the first through via electrode is formed of a metal, and the second through via electrode is formed of polycrystalline silicon doped with impurities.

19. The chip stack package of claim 15, wherein the first and second through via electrodes are formed entirely through the first chip.

20. The chip stack package of claim 15, wherein the first through via electrode comprises one of a power supply through via electrode and a ground through via electrode, and the second through via electrode comprises a signal transfer through via electrode.

21. A chip stack package comprising a plurality of chips that are stacked, and further comprising:
a first chip of the plurality of chips, the first chip having an upper surface and a lower surface;
a first through via electrode formed through at least a first portion of the first chip, at least a portion of the first through via electrode being exposed to the outside of the first chip at at least one surface of the first chip; and
a second through via electrode formed through at least the first portion of the first chip, at least a portion of the second through via electrode being exposed to the outside of the first chip at at least one surface of the first chip,
wherein at the first portion of the first chip, the first through via electrode is formed of copper and the second through via electrode is formed of polycrystalline silicon doped with impurities.

22. The chip stack package of claim 21, wherein the chips include a wafer and the chips are stacked at a wafer level, thereby comprising a wafer stack package.

23. The chip stack package of claim 21, wherein the chips are formed on a wiring substrate, and external input/output (I/O) terminals are formed on a bottom surface of the wiring substrate.

24. The chip stack package of claim 21, wherein a diameter of the first through via electrode is greater than a diameter of the second through via electrode.

25. The chip stack package of claim 24, wherein a diameter of the first through via electrode is in the range of about several μm to several tens of μm, and wherein a diameter of the second through via electrode is in the range of about several hundreds of nm to several μm.

26. The chip stack package of claim 21, wherein:
the first material is continuously formed along the length of the first through via electrode at least through two of the plurality of chips, and
the second material is continuously formed along the length of the second through via electrode at least through two of the plurality of chips.

27. The chip stack package of claim 21, wherein the first through via electrode comprises a power supply through via electrode, and further comprising:
a third through via electrode formed through at least the first portion of the first chip, the third through via electrode comprising a ground through via electrode,
wherein at the first portion of the first chip, the third through via electrode is formed of polycrystalline silicon doped with impurities, and the third through via electrode has substantially the same cross section size as the first through via electrode.

28. A chip stack package comprising a plurality of chips that are stacked, and further comprising:
a first chip of the plurality of chips, the first chip having an upper surface and a lower surface;
a first through via electrode formed through at least a first portion of the first chip, at least a portion of the first through via electrode being exposed to the outside of the first chip at at least one surface of the first chip; and
a second through via electrode formed through at least the first portion of the first chip, at least a portion of the second through via electrode being exposed to the outside of the first chip at at least one surface of the first chip,
wherein at the first portion of the first chip, the first through via electrode is formed of a first material and the second through via electrode is formed of a second material different from the first material,
wherein the first material is continuously formed along the length of the first through via electrode at least through two of the plurality of chips, and
wherein the second material is continuously formed along the length of the second through via electrode at least through two of the plurality of chips.

29. The chip stack package of claim 28, wherein a resistivity of the first material is smaller than a resistivity of the second material.

30. The chip stack package of claim 29, wherein the first through via electrode is formed of copper, and the second through via electrode is formed of polycrystalline silicon doped with impurities.

31. The chip stack package of claim 28, wherein the chips include a wafer and the chips are stacked at a wafer level, thereby comprising a wafer stack package.

32. The chip stack package of claim 28, wherein the chips are formed on a wiring substrate, and external input/output (I/O) terminals are formed on a bottom surface of the wiring substrate.

33. The chip stack package of claim 28, wherein a diameter of the first through via electrode is greater than a diameter of the second through via electrode.

34. The chip stack package of claim 28, wherein a diameter of the first through via electrode is in the range of about several μm to several tens of μm, and wherein a diameter of the second through via electrode is in the range of about several hundreds of nm to several μm.

35. The chip stack package of claim 28, wherein the first through via electrode comprises a power supply through via electrode, and further comprising:
a third through via electrode formed through at least the first portion of the first chip, the third through via electrode comprising a ground through via electrode,
wherein at the first portion of the first chip, the third through via electrode is formed of the second material, and the third through via electrode has substantially the same cross section size as the first through via electrode.

36. A chip stack package comprising a plurality of chips that are stacked, and further comprising:
a first chip of the plurality of chips, the first chip having an upper surface and a lower surface;
a first through via electrode formed through the first chip, at least a portion of the first through via electrode being disposed at at least one of the upper surface and the lower surface of the first chip; and
a second through via electrode formed through the first chip, at least a portion of the second through via electrode being disposed at the at least one of the upper surface and the lower surface of the first chip,
wherein the first through via electrode includes a first material, and the second through via electrode includes a second material and does not include the first material.

37. The chip stack package of claim 36, wherein the first through via electrode is formed of copper and the second through via electrode is formed of polycrystalline silicon doped with impurities.

38. The chip stack package of claim 36, wherein:
the first material is continuously formed along the length of the first through via electrode at least through two of the plurality of chips, and
the second material is continuously formed along the length of the second through via electrode at least through two of the plurality of chips.

39. The chip stack package of claim 36, wherein:
the first through via electrode is continuously formed through at least two of the plurality of chips, and
the second through via electrode is continuously formed through at least two of the plurality of chips.

* * * * *